United States Patent
Kim et al.

(10) Patent No.: US 11,251,061 B2
(45) Date of Patent: Feb. 15, 2022

(54) ELECTROSTATIC CHUCK AND MANUFACTURING METHOD THEREFOR

(71) Applicants: KSM COMPONENT CO., LTD., Gimpo-si (KR); FLOWSERVE KSM CO., LTD., Gimpo-si (KR)

(72) Inventors: Yun Ho Kim, Seoul (KR); Joo Hwan Kim, Seoul (KR); Ki Ryong Lee, Gimpo-si (KR)

(73) Assignees: KSM COMPONENT CO., LTD., Gimpo-si (KR); FLOWSERVE KSM CO., LTD., Gimpo-si (KR)

( * ) Notice: Subject to any disclaimer, the term of this patent is extended or adjusted under 35 U.S.C. 154(b) by 0 days.

(21) Appl. No.: 16/973,112

(22) PCT Filed: Oct. 31, 2019

(86) PCT No.: PCT/KR2019/014528
§ 371 (c)(1),
(2) Date: Dec. 8, 2020

(87) PCT Pub. No.: WO2020/096267
PCT Pub. Date: May 14, 2020

(65) Prior Publication Data
US 2021/0249260 A1 Aug. 12, 2021

(30) Foreign Application Priority Data
Nov. 8, 2018 (KR) .................. 10-2018-0136671

(51) Int. Cl.
*H01L 21/02* (2006.01)
*C04B 35/111* (2006.01)
(Continued)

(52) U.S. Cl.
CPC ........ *H01L 21/6833* (2013.01); *C04B 35/111* (2013.01); *C04B 35/117* (2013.01);
(Continued)

(58) Field of Classification Search
CPC ... C04B 35/111; C04B 35/117; H01L 21/6833
See application file for complete search history.

(56) References Cited

U.S. PATENT DOCUMENTS 5,998,321 A 12/1999 Katsuda et al.
9,136,031 B2 * 9/2015 Ito ..................... C04B 35/6455
(Continued)

FOREIGN PATENT DOCUMENTS

| CN | 1988128 A | 6/2007 |
| CN | 101335227 A | 12/2008 |

(Continued)

OTHER PUBLICATIONS

Korea Intellectual Property Office, Notice regarding Accelerated Examination for KR 10-2018-0136671 dated Feb. 13, 2019.
(Continued)

*Primary Examiner* — Karl E Group
(74) *Attorney, Agent, or Firm* — Sughrue Mion, PLLC

(57) ABSTRACT

Disclosed are: an electrostatic chuck having a high volume resistivity so as to reduce a leakage current, thereby improving the adsorption and desorption response characteristics of a semiconductor wafer; and a manufacturing method therefor. The electrostatic chuck is a sintered body in which an electrode is impregnated so as to fix a semiconductor wafer by electrostatic force, and comprises alumina, a sintering aid, and a rare earth composite oxide comprising two to five different rare earth metals, has adsorption and desorption response characteristics of a semiconductor wafer of two seconds or less, and has a volume resistivity at room temperature of 1.0E+16 Ω·cm to 1.0E+17 Ω·cm.

6 Claims, 1 Drawing Sheet

(51) Int. Cl.
    *H01L 21/683*     (2006.01)
    *H01L 21/687*     (2006.01)
    *C04B 35/645*     (2006.01)
    *C04B 35/117*     (2006.01)

(52) U.S. Cl.
    CPC ...... *C04B 35/645* (2013.01); *H01L 21/68757* (2013.01); *C04B 2235/3224* (2013.01); *Y10T 279/23* (2015.01)

(56) References Cited

U.S. PATENT DOCUMENTS

| | | |
|---|---|---|
| 2005/0152089 A1 | 7/2005 | Matsuda et al. |
| 2006/0199722 A1 | 9/2006 | Aihara et al. |
| 2007/0146961 A1 | 6/2007 | Morioka et al. |
| 2009/0002913 A1 | 1/2009 | Naim |
| 2010/0056358 A1 | 3/2010 | Teratani et al. |
| 2010/0227145 A1* | 9/2010 | Teratani ............... C04B 35/117 428/220 |
| 2011/0149462 A1 | 6/2011 | Kugimoto et al. |
| 2012/0231945 A1 | 9/2012 | Watanabe et al. |
| 2012/0248716 A1 | 10/2012 | Nobori et al. |
| 2013/0285336 A1* | 10/2013 | Ito ............... H01B 1/08 279/128 |
| 2014/0204501 A1 | 7/2014 | Moriya et al. |
| 2016/0251265 A1 | 9/2016 | Takahashi et al. |
| 2017/0057875 A1 | 3/2017 | Ishizuka et al. |
| 2019/0284100 A1 | 9/2019 | Mitsuya et al. |
| 2020/0219747 A1 | 7/2020 | Kim et al. |

FOREIGN PATENT DOCUMENTS

| | | |
|---|---|---|
| CN | 102738054 A | 10/2012 |
| CN | 105980331 A | 9/2016 |
| CN | 108346611 A | 7/2018 |
| EP | 0 905 106 A2 | 3/1999 |
| EP | 1 801 961 A2 | 6/2007 |
| EP | 2 163 535 A1 | 3/2010 |
| JP | 2010-077012 A | 4/2010 |
| JP | 2010-208871 A | 9/2010 |
| JP | 2011-136877 A | 7/2011 |
| JP | 2011-151336 A | 8/2011 |
| JP | 2013-241322 A | 12/2013 |
| JP | 2014-138164 A | 7/2014 |
| JP | 2016-124734 A | 7/2016 |
| KR | 10-0618530 B1 | 8/2006 |
| KR | 10-2010-0027074 A | 3/2010 |
| KR | 10-0962210 B1 | 6/2010 |
| KR | 10-0982649 B1 | 9/2010 |
| KR | 10-1103821 B1 | 1/2012 |
| KR | 10-1553816 B1 | 9/2015 |
| KR | 10-1682749 B1 | 12/2016 |
| KR | 10-1769608 B1 | 8/2017 |
| KR | 10-2017-0127636 A | 11/2017 |
| KR | 10-1797232 B1 | 11/2017 |
| WO | 2015/056702 A1 | 4/2015 |
| WO | 2018/016419 A1 | 1/2018 |

OTHER PUBLICATIONS

Korea Intellectual Property Office, Decision to Grant Patent for KR 10-2018-0136671 dated Mar. 22, 2019.
International Searching Authority, International Search Report for PCT/KR2019/014528 dated Feb. 12, 2020.

\* cited by examiner

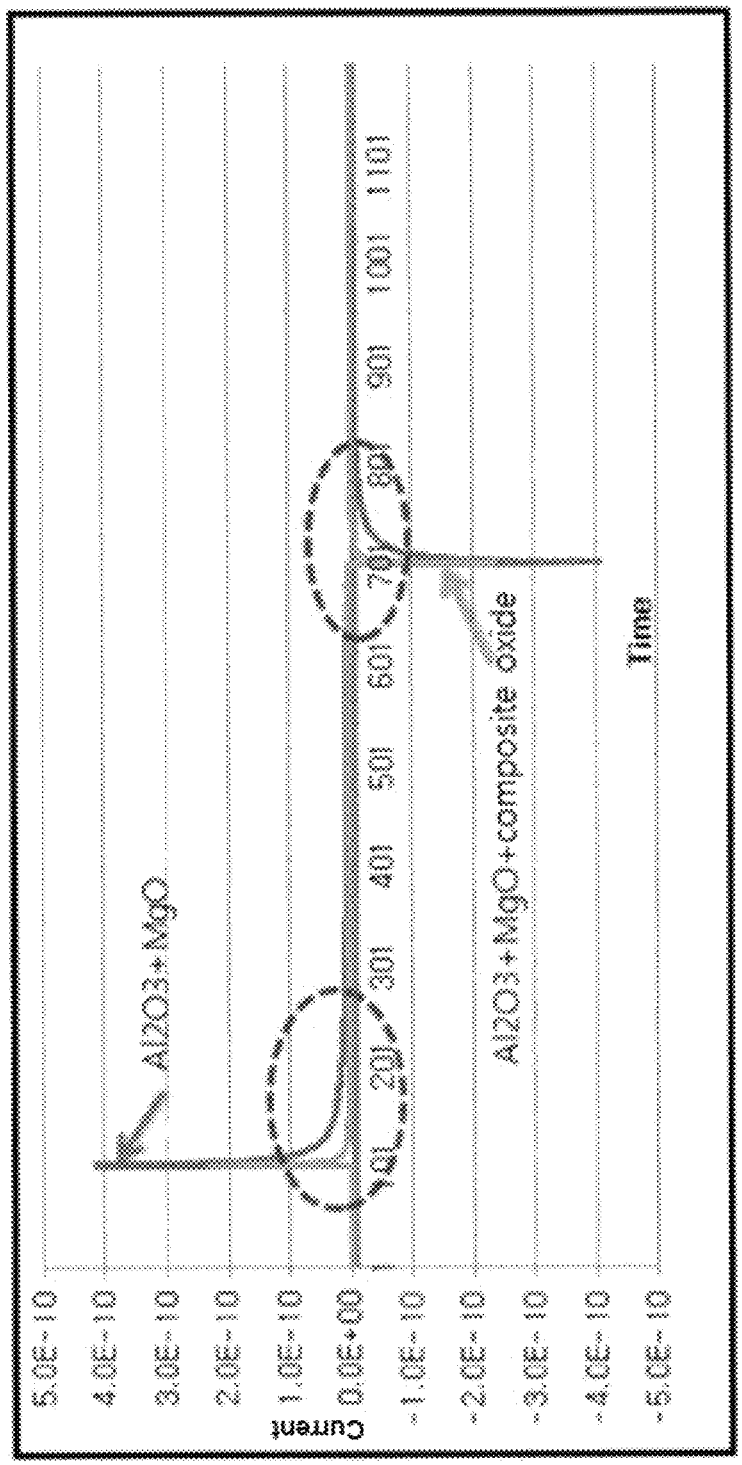

ELECTROSTATIC CHUCK AND MANUFACTURING METHOD THEREFOR

TECHNICAL FIELD

This application is a National Stage of International Application No. PCT/KR2019/014528 filed Oct. 31, 2019, claiming priority based on Korean Patent Application No. 10-2018-0136671 filed Nov. 8, 2018, the entire contents of which are incorporated herein by reference.

The present invention relates to an electrostatic chuck for fixing a semiconductor wafer, etc. by an electrostatic force, more particularly, to an electrostatic chuck capable of improving adsorption and desorption response characteristics of a semiconductor wafer by reducing a leakage current due to high volume resistivity and a method of manufacturing the same.

BACKGROUND ART

An electrostatic chuck (ESC) is a device that horizontally fixes a semiconductor wafer or LCD glass substrate by using an electrostatic force, and is largely classified into a Coulomb-type electrostatic chuck and a Johnson-Rahbek-type electrostatic chuck according to the adsorption method. Among them, the Johnson-Rahbek-type electrostatic chuck generally has a low volume resistivity characteristic of $1 \times 10^9 \sim 1 \times 10^{12}$ Ω·cm, charges electric charges on the wafer adsorption surface of the dielectric due to its low volume resistivity characteristics, and fixes the wafer through electrostatic attraction of these surface charges. On the other hand, the Coulomb-type electrostatic chuck fixes the wafer by using electrostatic attraction between different charges existing on the upper and lower surfaces of the dielectric. In the Coulomb-type electrostatic chuck, only when the volume resistivity of the dielectric is $1 \times 10^{15}$ Ω·cm or more, the leakage current is small and the wafer desorption performance is excellent, and as the size of the semiconductor wafer is increased, sufficient electrostatic adsorption force may not be uniformly formed over the entire wafer contact surface.

Meanwhile, for electrostatic chuck, a material mainly made of aluminum such as aluminum oxide ($Al_2O_3$) or aluminum nitride (AlN) is used. However, since the sintered body of aluminum oxide has a volume resistivity rate of $1 \times 10^{14}$ Ω·cm or more at room temperature, the electrostatic chuck should be manufactured using the Coulomb-type method rather than the Johnson-Rahbek-type method, in order to use aluminum oxide as the main raw material and to have sufficient adsorption rate and excellent current response characteristics.

However, the conventional Coulomb type electrostatic chuck has a problem in that the volume resistivity is not high when it is out of a specific temperature range, and it is not easy to maintain the volume resistivity even under a specific temperature, and thus the adsorption force is unstable. In addition, the conventional electrostatic chuck has a disadvantage in that there is a large amount of current leaking from the electrostatic chuck to the substrate, and the response speed at the time of substrate desorption is slow, and thus good desorption response cannot be obtained. Accordingly, there is a need to develop a novel Coulomb-type electrostatic chuck which is capable of solving the above problems.

DISCLOSURE

Technical Problem

Therefore, the present invention relates to an electrostatic chuck capable of improving adsorption and desorption response characteristics of a semiconductor wafer by reducing a leakage current by high volume resistivity and a method of manufacturing the same.

Technical Solution

In order to achieve the above objects, the present invention relates to an electrostatic chuck, which is a sintered body in which an electrode is impregnated so as to fix a semiconductor wafer by electrostatic force, and which comprises alumina; a sintering aid; and a rare earth composite oxide comprising two to five different rare earth metals, has adsorption and desorption response characteristics of a semiconductor wafer of two seconds or less, and has a volume resistivity at room temperature of 1.0E+16 to 1.0E+17 Ω·cm.

In addition, the present invention provides a method of manufacturing the electrostatic chuck comprising the steps of a) preparing a rare earth composite oxide containing 2 to 5 different rare-earth metals by wet-mixing two or more different rare-earth metal oxide powders and a solvent under milling, and then drying, granulating and heat-treating it; b) supplying alumina, a sintering aid, alcohol and a binder to the prepared rare earth composite oxide, and then mixing them; c) drying the mixture in step b) to remove the alcohol component; d) molding and processing the dried mixture to prepare a pre-molded body; e) degreasing the pre-molded body to remove the binder component; and f) sintering the degreased pre-molded body and then polishing it.

Advantageous Effects

According to the electrostatic chuck and its manufacturing method according to the present invention, the leakage current is reduced by high volume resistivity, so adsorption and desorption response characteristics of the semiconductor wafer can be improved.

DESCRIPTION OF DRAWINGS

FIG. 1 is a graph comparing and contrasting the substrate adsorption and desorption time period of the electrostatic chuck according to one Example of the present invention and the substrate adsorption and desorption time period of the electrostatic chuck according to the Comparative Example.

BEST MODE

Hereinafter, the present invention will be described in detail.

The electrostatic chuck according to the present invention is a Coulomb-type electrostatic chuck, which is a sintered body in which an electrode is impregnated so as to fix a semiconductor wafer by electrostatic force, and which comprises alumina; a sintering aid; and a rare earth composite oxide comprising two to five different rare earth metals, has adsorption and desorption response characteristics of the semiconductor wafer of two seconds or less, and has a volume resistivity at room temperature of 1.0E+16 to 1.0E+17 Ω·cm.

The rare earth composite oxide is to lower the conductivity of the electrostatic chuck and may be used in a very small amount, and may include two or more, preferably 2 to 5 different rare-earth metal oxides. The rare-earth metal may be scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu) and the like. In addition, the purity of the rare-earth metal oxide containing such a rare-earth metal is preferably 99% or more, but is not limited thereto. In addition, the phase of the rare-earth metal oxide is powder, and its particle size is preferably 10 μm or less, but is not limited thereto.

Therefore, the rare earth composite oxide is not particularly limited as long as it is a composite oxide of 2 to 5 different rare-earth metal oxides, for example, a composite oxide comprising two different rare-earth metals, such as, europium-gadolinium composite oxide ($EuGdO_X$), samarium-gadolinium composite oxide ($SmGdO_X$), cerium-europium composite oxide ($CeEuO_X$), samarium-cerium composite oxide ($SmCeO_X$), gadolinium-samarium composite oxide ($GdSmO_X$) and lanthanum-cerium composite oxide ($LaCeO_X$), a composite oxide comprising three different rare-earth metals, such as, samarium-cerium-europium composite oxide ($SmCeEuO_X$), gadolinium-cerium-lanthanum composite oxide ($GdCeLaO_X$) and europium-gadolinium-samarium composite oxide ($EuGdSmO_X$), a composite oxide comprising four different rare-earth metals, such as, samarium-cerium-gadolinium-europium composite oxide ($SmCeGdEuO_X$) and gadolinium-samarium-europium-lanthanum composite oxide ($GdSmEuLaO_X$), a composite oxide comprising five different rare-earth metals, such as, samarium-cerium-europium-gadolinium-lanthanum composite oxide ($SmCeEuGdLaO_X$) or so on.

If the rare earth composite oxide contains two or more different rare-earth metal oxides, one rare-earth metal can be solid-dissolved in the other (or any) rare-earth metal oxide. Through this, the crystal of any one rare-earth metal oxide is changed, and thus, the rare earth composite oxide may have an increased oxygen lattice defect compared to a single rare-earth metal oxide. That is, the rare earth composite oxide applied to the present invention is different from a simple mixture of two rare-earth metal oxides as well as a single rare-earth metal oxide.

In this way, the rare earth composite oxide with increased oxygen lattice defects improves interfacial reactivity, thereby effectively reacting with the interface of alumina or lattice oxygen, so that the composite oxide can be formed along the grain boundaries of alumina (i.e., a conductive crystal phase is formed along the grain boundaries of the alumina). Meanwhile, the conductivity may increase or decrease depending on the content of the rare earth composite oxide. Specifically, if the rare earth composite oxide is used in an amount of 1 wt. % or less, it may be located at the interface to decrease the conductivity, if the rare earth composite oxide is used in an amount of several wt. %, the conductivity is rather increased, and if the rare earth composite oxide is used in an amount of several tens of wt. %, the conductivity is decreased again. Therefore, in the present invention relating to the Coulomb-type electrostatic chuck, the rare earth composite oxide may be used in a very small amount of more than 0 wt. % and 1 wt. % or less (preferably 0.01 to 1 wt. %, more preferably 0.1 to 1 wt. %) or in an amount of several tens wt. % relative to the total weight of the sintered body (alumina+sintering aid such as magnesium oxide+rare earth composite oxide).

In addition, the rare earth composite oxide may contain different types of rare-earth metal oxides in various mixing ratios. For example, the rare earth composite oxide can be prepared by properly blending single rare-earth metal oxides so that the target effect of the rare earth composite oxide can be maximized, ad for example, the rare earth composite oxide may contains two rare-earth metal oxides in a weight ratio of 2.5 to 3.5:1, three rare-earth metal oxides in a weight ratio of 1 to 3.5:0.5 to 2.5:1, four rare-earth metal oxides in a weight ratio of 1.5 to 3.5:0.5 to 2.5:1 to 2.5:1, or five rare-earth metal oxides in a weight ratio of 1 to 3:0.5 to 1.5:0.5 to 1.5:1 to 2:1 or so on.

More specifically, $SmCeEuO_X$ contains each rare-earth metal oxide in a weight ratio of 2:1:1, $GdCeLaO_X$ contains in a weight ratio of 3:2:1, $EuGdSmO_X$ contains in a weight ratio of 1.5:1.5:1, $SmCeGdEuO_X$ contains in a weight ratio of 2:1:1.5:1, $GdSmEuLaO_X$ contains in a weight ratio of 3:2:2:1, and $SmCeEuGdLaO_X$ contains in a weight ratio of 2:1:1:1.5:1.

The alumina ($Al_2O_3$) is a main component of an electrostatic chuck, which is used to uniformly maintain the surface temperature of the electrostatic chuck. It is preferable that the alumina ($Al_2O_3$) has a purity of 99% or more, preferably 99.5% or more. In addition, the content of alumina is 90 wt. % to 99 wt. %, preferably 92 wt. % to 99 wt. %, and more preferably 95 wt. % to 99 wt. %, based on the total weight of the sintered body. If the content of alumina is less than 90 wt. %, the original physical characteristics of alumina such as volume resistivity and response characteristics may be deteriorated as the content of the remaining sintering aid and the like is increased. If the alumina content exceeds 99 wt. %, there may be a problem that it is difficult to obtain a uniform sintered body. In addition, descriptions related to alumina not described herein may apply mutatis mutandis to descriptions known in the art.

The sintering aid contains at least one selected from the group consisting of magnesium oxide (MgO), yttria ($Y_2O_3$), and silicon dioxide ($SiO_2$), and the sintering aid is used to increase the amount of solid solution of rare-earth metal in the rare earth composite oxide and is used for generation of liquid phases, suppression of grain boundary migration, and acceleration of material transport rates during sintering. The content of the sintering aid is more than 0 wt. % and 10 wt. % or less, preferably 0.5 wt. % to 10 wt. % or less, more preferably 1 wt. % to 10 wt. % or less, based on the total weight of the sintered body. If the content of the sintering aid is out of the above range, there may be a problem that the volume resistivity rate of the electrostatic chuck is lowered. In addition, descriptions related to magnesium oxide not described herein may apply mutatis mutandis to descriptions known in the art.

Meanwhile, the electrostatic chuck according to the present invention has a volume resistivity rate of $1.0E+16$ to $1.0E+17$ Ω·cm at room temperature, and preferably about $1.0E+17$ Ω·cm, as described above. In addition, the electrostatic chuck of the present invention is characterized in that the amount of leakage current is less than 0.08 μA, preferably 0.03 to 0.075 μA.

Meanwhile, the alumina and sintering aid may be composed of various phases, but a powder phase is most preferred, and the powder particles may have a nanometer to micrometer size. Therefore, the alumina and the sintering aid may be of nano-nano, nano-micro, micro-nano and micro-micro sizes. If at least one of the alumina and the sintering aid has a nano size, the response characteristics, volume resistivity and the like of the electrostatic chuck may be excellent. If both the alumina and the sintering aid have nano-sized particles, they can have the best characteristics. The reason is that the nano-sized case has a more complex microstructure than the micro-sized case, and the generation and is more limited in the generation and transfer of charges. In addition, as an example, if both the alumina and the sintering aid are set to a nano size, the sintering temperature is about 1,450 to 1,550° C., and if both the alumina and the sintering aid are set to a micro size, the sintering temperature is about 1,600 to 1,700° C. When sintering at a relatively low temperature, there are advantages that the time period required for the process is shortened and so forth, and also, when sintering the nano-powder, uniform grain can be obtained. Accordingly, it is preferable that both the alumina and the sintering aid are of nano-sized size.

Next, the method of manufacturing the electrostatic chuck according to the present invention will be described. The method of manufacturing the electrostatic chuck according to the present invention comprises the steps of a) preparing a rare earth composite oxide containing 2 to 5 different rare-earth metals by wet-mixing two or more different rare-earth metal oxide powders and a solvent under milling, and then drying, granulating and heat-treating it; b) supplying alumina, a sintering aid, alcohol and a binder to the prepared rare earth composite oxide, and then mixing them; c) drying the mixture in step b) to remove the alcohol component; d) molding (a first molding) and processing the dried mixture to prepare a pre-molded body; e) degreasing the pre-molded body to remove the binder component; and f) sintering (a second molding) the degreased pre-molded body and then polishing it.

The description of the rare-earth metal oxide used in step a) and the rare earth composite oxide produced and the sintering aid in step b) are as described above, and examples of the solvent may be those conventionally used in the art. Specifically, organic solvents commonly used such as isopropyl alcohol (IPA), ethanol, methanol, and DI water may be exemplified. In addition, the rare earth composite oxide, alumina and sintering aid may be composed of various phases, but a powder phase is most preferred.

The milling in step a) may be performed by conventional milling methods such as a ball mill, a planetary mill, and an attrition mill. Among them, the balls used in the ball mill are zirconia, and the sizes of the balls may be the same or different, and the milling time period or the rotation speed of the milling machine may be appropriately set in consideration of the size of the target particles. In addition, the wet-mixing may be performed for 12 hours or more, the drying to granulate the powder may be performed at a temperature of 100° C. or less, and the heat-treating may be performed under a temperature of 1,000° C. or less for 5 to 10 hours. In addition, the rare earth composite oxide produced in step a) may be in the form of particulates by an additional grinding process if necessary.

The alcohol (compound) added in step b) is used for proper mixing between rare earth oxides, and may be exemplified by ethanol, methanol, isopropyl alcohol and the like. Likewise, the binder added in step b) is for manufacturing a molded body by improving the bonding strength of the rare earth composite oxide, alumina and magnesium oxide, and may be exemplified by polyvinyl alcohol (PVA), polyvinyl butyral (PVB) and the like. Meanwhile, the rare earth composite oxide, alumina and sintering aid mixed in step b) may be blended in an amount of 1 wt. % or less, 90 wt. % to 99 wt. %, and more than 0 wt. % and 10 wt. % or less, respectively.

The drying in step c) may be performed by methods known in the art, such as spray drying method and vacuum drying method, and the drying time period can be applied in various ways depending on the physical properties of the electrostatic chuck for the purpose.

The molding in step d) is a first molding process to control the size and shape of the mixture dried in step c) into a target size and shape and may be illustrated by press molding or the like. At this time, in order to manufacture a product of a more compact standard, if necessary, cold isostatic press (CIP) molding can be additionally performed. The press molding is preferably performed under room temperature and general atmosphere, but is not limited thereto, and the atmosphere during molding should be such that it does not affect the molding of the mixture. In addition, after the molding process in step d) is performed, a pre-molded body may be manufactured by performing processing using a green processing (done before sintering) method or the like.

The degreasing of step e) is a process for removing the binder and contaminants having oily characteristics and may be performed at a temperature of 350 to 600° C. for a period of within 60 hours. Finally, the sintering of step f) is a second molding process to further improve the volume resistivity of the electrostatic chuck (Hot Press), and may be performed in a high-temperature pressurized sintering furnace under a pressure of 300 bar or less and a temperature of 1,400 to 1,700° C.

As described above, according to the electrostatic chuck and its manufacturing method according to the present invention, the Coulomb-type electrostatic chuck not only has a very high-volume resistivity even in a wide temperature range, but also can provide a stable adsorption force. In addition, the electrostatic chuck according to the present invention can reduce the leakage current from the electrostatic chuck to the substrate, and can obtain good adsorption response characteristics and desorption response characteristics due to a fast response speed within 2 seconds at the time of substrate adsorption and desorption and so forth, and thus the present invention can be said to be a unique technology having a remarkable effect compared to the conventional electrostatic chuck.

Hereinafter, the present invention will be described in more detail through specific examples. The following examples are intended to illustrate the present invention, and the present invention is not limited by the following examples.

[Example 1] Manufacturing of Electrostatic Chuck Using Rare Earth Composite Oxide First, in the presence of a ball mill, samarium oxide and cerium oxide in a weight ratio of 3:1 and ethanol (solvent) are wet-mixed, and then dried by spray drying and heat-treated for 3 hours at a temperature of 800° C. to prepare samarium-cerium composite oxide ($SmCeO_x$). Subsequently, 0.5 wt. % of the prepared samarium-cerium composite oxide and 98.5 wt. % of alumina, 1 wt. % of magnesium oxide, ethanol, and polyvinyl butyral were mixed and dried, and the dried mixture was press-molded and processed to prepare a pre-molded body. The pre-molded body was degreased for 30 hours at a temperature of 500° C., and finally, the degreased pre-molded body was sintered and polished in a high-temperature pressurized sintering furnace (pressure of 250 bar, temperature of 1,700° C.) to manufacture a Coulomb-type electrostatic chuck.

[Example 2] Manufacturing of Electrostatic Chuck Using Rare Earth Composite Oxide A Coulomb-type electrostatic chuck was manufactured in the same manner as in Example 1 above, except that samarium-cerium-europium composite oxide ($SmCeEuO_x$) is prepared by mixing samarium oxide, cerium oxide, and europium oxide in a weight ratio of 2:1:1 instead of mixing only samarium oxide and cerium oxide.

[Example 3] Manufacturing of Electrostatic Chuck Using Rare Earth Composite Oxide A Coulomb-type electrostatic chuck was manufactured in the same manner as in Example 1 above, except that samarium-cerium-europium-gadolinium-lanthanum composite oxide ($SmCeEuGdLaO_x$) is prepared by mixing samarium oxide, cerium oxide, europium oxide, gadolinium oxide, and lanthanum oxide in a weight ratio of 2:1:1:1.5:1, instead of mixing only samarium oxide and cerium oxide.

[Comparative Example 1] Manufacturing of Electrostatic Chuck Excluding Rare-Earth Metal Oxide A conventional Coulomb-type electrostatic chuck containing only alumina and titanium dioxide ($TiO_2$) was manufactured.

[Comparative Example 2] Manufacturing of Electrostatic Chuck Excluding Magnesium Oxide A Coulomb-type electrostatic chuck was manufactured in the same manner as in Example 1 above, except that titanium dioxide was used instead of magnesium oxide.

[Comparative Example 3] Manufacturing of Electrostatic Chuck Excluding Rare-Earth Metal Oxide A conventional Coulomb-type electrostatic chuck containing only alumina and magnesium oxide was manufactured.

[Comparative Example 4] Manufacturing of Electrostatic Chuck Excluding Magnesium Oxide A Coulomb-type electrostatic chuck was manufactured in the same manner as in Example 1 above, except that yttria ($Y_2O_3$) was used instead of magnesium oxide.

[Comparative Example 5] Manufacturing of an Electrostatic Chuck Excluding Rare-Earth Metal Oxide and Magnesium Oxide Yttria ($Y_2O_3$) instead of rare earth composite oxide and magnesium oxide was used to prepare a Coulomb-type electrostatic chuck.

[Comparative Example 6] Manufacturing of Electrostatic Chuck Using Only Alumina

A Coulomb-type electrostatic chuck was manufactured using only alumina, while excluding rare earth composite oxide and magnesium oxide.

[Experimental Example 1] Evaluation of Substrate Adsorption and Desorption Response Characteristics of Electrostatic Chuck The adsorption and desorption response characteristics of the substrate were evaluated by repeating the process of adsorbing and then desorbing a silicon substrate (semiconductor wafer) to each electrostatic chuck (each composition is shown in Table 1 below) prepared from Examples 1 to 3 and Comparative Examples 1 to 6, five times, and the results are shown in Table 2 below. Meanwhile, to evaluate the adsorption and desorption response characteristics of the substrate, a power source for applying ESC voltage (ESC 3D, COMDEL company) was used, and after applying a voltage of 1,000 V, the adsorption and desorption time periods of the Si wafer on the ESC were investigated.

TABLE 1

|  | $Al_2O_3$ | MgO | $Y_2O_3$ | $TiO_2$ | Rare earth composite oxide |
|---|---|---|---|---|---|
| Example 1 | 98.5 | 1 | 0 | 0 | 0.5 |
| Example 2 | 98.5 | 1 | 0 | 0 | 0.5 |
| Example 3 | 98.9 | 1 | 0 | 0 | 0.1 |
| Comparative Example 1 | 99 | 0 | 0 | 1 | 0 |
| Comparative Example 2 | 98.5 | 0 | 0 | 1 | 0.5 |
| Comparative Example 3 | 99 | 1 | 0 | 0 | 0 |
| Comparative Example 4 | 97.9 | 0 | 2 | 0 | 0.1 |
| Comparative Example 5 | 98 | 0 | 2 | 0 | 0 |
| Comparative Example 6 | 100 | 0 | 0 | 0 | 0 |

(unit: wt. %)

TABLE 2

|  | Adsorption and desorption response characteristics of substrate | |
|---|---|---|
|  | Adsorption | Desorption |
| Example 1 | within 2 seconds | within 2 seconds |
| Example 2 | within 1 second | within 1 second |
| Example 3 | within 2 seconds | within 2 seconds |
| Comparative Example 1 | about 10 seconds | about 10 seconds |
| Comparative Example 2 | about 7 seconds | about 7 seconds |
| Comparative Example 3 | about 10 seconds | about 10 seconds |
| Comparative Example 4 | about 5 seconds | about 5 seconds |
| Comparative Example 5 | about 6 seconds | about 6 seconds |
| Comparative Example 6 | about 5 seconds | about 5 seconds |

FIG. 1 is a graph comparing and contrasting the substrate adsorption and desorption time period of the electrostatic chuck ($Al_2O_3$+MgO+rare earth composite oxide, Example 1) according to one Example of the present invention and the substrate adsorption and desorption time period of the electrostatic chuck ($Al_2O_3$+MgO, Comparative Example 3) according to the Comparative Example. As can be seen from Table 2 and FIG. 1, it was confirmed that time period of stabilization after the initial voltage application and stabilization time period after the removal of voltage for the electrostatic chuck of Comparative Examples 1 to 6, which does not contain alumina, magnesium oxide, and rare earth composite oxide together, were about 5 to 10 seconds, whereas stabilization time periods after voltage application and removal for the electrostatic chuck according to the present invention were within 2 seconds. This is due to the rapid stabilization of the chucking time and dechucking time of the substrate by the use of the rare earth composite oxide as well as specific contents of the alumina, the magnesium oxide and the rare earth composite oxide.

[Experimental Example 2] Evaluation of the Amount of Leakage Current of the Electrostatic Chuck The amount of current leaked after adsorption of a silicon substrate to each electrostatic chuck prepared from Examples 1 to 3 and Comparative Examples 1 to 6 and then supply of the electrical power was measured using a DMM-4020 multimeter (Tektronix company, USA), and the results are shown in Table 3 below. The method of measuring the amount of leakage current described above will be described in more detail as follows. First, a ceramic puck was installed on the equipment at room temperature, and then a Si wafer was placed on it, and then a voltage of 1,500 V was applied to the alumina puck using the power source equipment for applying the ESC voltage used in Experimental Example 1, and finally, the leakage current applied to both ends of the silicon wafer was measured using the DMM-4020 multimeter equipment. At this time, the measurement is performed by measuring the current value 10 seconds after application of the voltage of 1,500 V.

TABLE 3

|  | Amount of leakage current(unit: μA) |
|---|---|
| Example 1 | 0.065 |
| Example 2 | 0.061 |
| Example 3 | 0.072 |
| Comparative Example 1 | 1.452 |
| Comparative Example 2 | 1.523 |
| Comparative Example 3 | 0.785 |
| Comparative Example 4 | 0.095 |
| Comparative Example 5 | 0.522 |
| Comparative Example 6 | 0.688 |

As can be seen from Table 3, in the case of the electrostatic chuck of Comparative Examples 1 to 6, which does not contain alumina, magnesium oxide, and rare-earth composite oxide together, a current of about 0.09 to 1.5 μA leaked, whereas the electrostatic chuck according to the present invention had an amount of leakage current of only 0.06 to 0.07 μA. the larger the amount of leakage current is, the more the substrate may be affected or the process may be affected. Therefore, for ESCs or heaters, it is better if the amount of leakage current in the process is as small as possible. Therefore, through the above results, it is possible to confirm the excellence of the present invention.

[Experimental Example 3] Evaluation of Volume Resistivity of Electrostatic Chuck When 1 minute elapses after applying a voltage of 500 V/mm to each electrostatic chuck manufactured from Examples 1 to 3 and Comparative Examples 1 to 6, the volume resistivity was calculated by measuring the current (measured under vacuum atmosphere and room temperature), and the results are shown in Table 4 below.

TABLE 4

|  | Volume resistivity(Ω · cm) | |
|---|---|---|
|  | @ RT | @ 300° C. |
| Example 1 | 2.3E+16 | 2.8E+14 |
| Example 2 | 2.7E+16 | 3.0E+14 |
| Example 3 | 3.0E+16 | 3.1E+14 |
| Comparative Example 1 | 2.0E+14 | 5.3E+12 |
| Comparative Example 2 | 3.2E+14 | 6.0E+12 |
| Comparative Example 3 | 8.5E+15 | 1.8E+14 |
| Comparative Example 4 | 3.2E+16 | 4.0E+11 |
| Comparative Example 5 | 7.6E+15 | 2.3E+11 |
| Comparative Example 6 | 2.7E+15 | 4.9E+13 |

As shown in Table 4, all of the volume resistivity of the electrostatic chuck of Examples 1 to 3 using the rare earth composite oxide according to the present invention showed similar values to that of the Comparative Example at room temperature and 300° C. Through this, it was found that even if rare earth composite oxide is included in the electrostatic chuck, since the volume resistivity is neither lowered nor increased, the electrostatic chuck of the present invention has a volume resistivity almost equal to that of the existing Coulomb-type electrostatic chuck having an excellent volume resistivity. That is, even though the electrostatic chuck of the present invention has similar volume resistivity as compared to the existing electrostatic chuck, it has a meaning that the substrate adsorption and desorption response characteristics and the amount of leakage current are improved.

The invention claimed is:

1. An electrostatic chuck which is a sintered body in which an electrode is impregnated so as to fix a semiconductor wafer by electrostatic force,
   wherein the electrostatic chuck comprises alumina; magnesium oxide (MgO) as a sintering aid; and a rare earth composite oxide comprising three to five different rare earth metals,
   wherein a content of the alumina is 90 wt. % to 99 wt. % based a total weight of the sintered body,
   wherein a content of the rare earth composite oxide is more than 0 wt. % and 1 wt. % or less based on the total weight of the sintered body,
   wherein the electrostatic chuck has adsorption and desorption response characteristics of a semiconductor wafer of two seconds or less, and has a volume resistivity at room temperature of 1.0E+16 Ω·cm to 1.0E+17 Ω·cm,
   wherein the rare earth composite oxide is selected from the group consisting of a composite oxide comprising three different rare-earth metals selected from the group consisting of samarium-cerium-europium composite oxide ($SmCeEuO_x$), gadolinium-cerium-lanthanum composite oxide ($GdCeLaO_x$), and europium-gadolinium-samarium composite oxide ($EuGdSmO_x$); a composite oxide comprising four different rare-earth metals, which is samarium-cerium-gadolinium-europium composite oxide ($SmCeGdEuO_x$) or gadolinium-samarium-europium-lanthanum composite oxide ($GdSmEuLaO_x$); and a composite oxide comprising five different rare-earth metals, which is samarium-cerium-europium-gadolinium-lanthanum composite oxide ($SmCeEuGdLaO_x$), and
   wherein the rare earth composite oxide comprises three rare-earth metal oxides in a weight ratio of 1 to 3.5:0.5 to 2.5:1, four rare-earth metal oxides in a weight ratio of 1.5 to 3.5:0.5 to 2.5:1 to 2.5:1, or five rare-earth metal oxides in a weight ratio of 1 to 3:0.5 to 1.5:0.5 to 1.5:1 to 2:1.

2. The electrostatic chuck according to claim 1, wherein an amount of leakage current of the electrostatic chuck is less than 0.08 μA.

3. The electrostatic chuck according to claim 1, wherein a content of the sintering aid is more than 0 wt. % and 9 wt. % or less based on the total weight of the sintered body.

4. A method of manufacturing the electrostatic chuck of claim 1, comprising the steps of:
   a) preparing a rare earth composite oxide containing 3 to 5 different rare-earth metals by wet-mixing three or more different rare-earth metal oxide powders and a solvent under milling, and then drying, granulating, and heat-treating it;

b) supplying alumina, a sintering aid, alcohol and a binder to the prepared rare earth composite oxide, and then mixing them;
c) drying the mixture in step b) to remove the alcohol component;
d) molding and processing the dried mixture to prepare a pre-molded body;
e) degreasing the pre-molded body to remove the binder component; and
f) sintering the degreased pre-molded body and then polishing it.

5. The method of manufacturing the electrostatic chuck according to claim 4, wherein the binder is polyvinyl alcohol (PVA) or polyvinyl butyral (PVB).

6. The method of manufacturing the electrostatic chuck according to claim 4, wherein the rare earth composite oxide, the alumina, and the sintering aid are of powder phase.

* * * * *